United States Patent
Khachatryan

(10) Patent No.: US 9,362,159 B2
(45) Date of Patent: Jun. 7, 2016

(54) MANUFACTURING METHOD FOR DISPLAY DEVICE

(71) Applicant: Samsung Display Co., Ltd., Yongin (KR)

(72) Inventor: Hayk Khachatryan, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/304,350

(22) Filed: Jun. 13, 2014

(65) Prior Publication Data

US 2015/0187637 A1     Jul. 2, 2015

(30) Foreign Application Priority Data

Dec. 30, 2013    (KR) ........................ 10-2013-0167491

(51) Int. Cl.

| | | |
|---|---|---|
| *H01L 21/762* | (2006.01) | |
| *H01L 21/033* | (2006.01) | |
| *H01L 21/70* | (2006.01) | |
| *H01L 21/768* | (2006.01) | |
| *H01L 21/02* | (2006.01) | |

(52) U.S. Cl.
CPC .... *H01L 21/76254* (2013.01); *H01L 21/02661* (2013.01); *H01L 21/0331* (2013.01); *H01L 21/707* (2013.01); *H01L 21/76864* (2013.01)

(58) Field of Classification Search
CPC .................. H01L 21/02656; H01L 21/02658; H01L 21/02052; H01L 21/0201; H01L 21/02002; H01L 21/02005; H01L 21/76254; H01L 21/0331; H01L 21/02661; H01L 21/76864; H01L 21/707; B32B 37/14; B32B 37/144; B32B 38/10; B32B 43/006; C11D 7/32; C11D 7/38

See application file for complete search history.

(56) References Cited

U.S. PATENT DOCUMENTS

| | | |
|---|---|---|
| 4,107,388 A | 8/1978 | Gambaretto et al. |
| 5,415,927 A | 5/1995 | Hiayama et al. |
| 5,736,245 A | 4/1998 | Grabbe et al. |
| 5,885,362 A * | 3/1999 | Morinaga et al. .................. 134/2 |

(Continued)

FOREIGN PATENT DOCUMENTS

| | | | |
|---|---|---|---|
| JP | H9-64052 | * 3/1997 | ............ H01L 21/322 |
| KR | 1020080028162 | 2/2008 | |

(Continued)

OTHER PUBLICATIONS

M.M.R. Howlader et al., Room temperature wafer level glass/glass bonding, Feb. 28, 2006, Sensors and Actuators A, vol. 127, pp. 31-36, all pages.*

(Continued)

*Primary Examiner* — Victoria K Hall
(74) *Attorney, Agent, or Firm* — H.C. Park & Associates, PLC

(57) ABSTRACT

A method of manufacturing a display device that includes: performing a surface treatment on at least one of two opposing surfaces of a carrier substrate and a mother substrate; bonding the carrier substrate and the mother substrate; performing a thin film formation process on the mother substrate; and separating the carrier substrate and the mother substrate. The thin film formation process includes a heat treatment operation, the surface treatment includes using an inorganic acid or an organic acid, and the surface treatment controls a content of —OH, —$OH_2^+$, and —$O^-$ groups of the at least one treated surface.

20 Claims, 12 Drawing Sheets

(56) References Cited

U.S. PATENT DOCUMENTS

| | | | |
|---|---|---|---|
| 6,245,387 | B1 | 6/2001 | Hayden |
| 6,743,516 | B2 | 6/2004 | Murphy et al. |
| 2003/0047280 | A1* | 3/2003 | Takayama et al. ............ 156/344 |
| 2009/0252993 | A1* | 10/2009 | Kawai et al. ............... 428/846.9 |
| 2010/0159808 | A1* | 6/2010 | Shimodaira et al. ............ 451/36 |
| 2012/0202010 | A1 | 8/2012 | Uchida |
| 2013/0217236 | A1* | 8/2013 | Sato et al. ..................... 438/758 |
| 2014/0103492 | A1* | 4/2014 | Fusegawa et al. ............ 257/617 |

FOREIGN PATENT DOCUMENTS

| | | | |
|---|---|---|---|
| KR | 10-0931884 | | 12/2009 |
| KR | 1020100009772 | | 2/2010 |
| KR | 10-1150173 | | 5/2012 |
| WO | WO 2012/176370 | * | 12/2012 ............ H01L 21/322 |

OTHER PUBLICATIONS

S. Mack et al., Gas development at the interface of directly bonded silicon wafers: investigation of silicon-based pressure sensors, Aug. 1996, Sensors and Actuators A, vol. 56, Issue 3, pp. 273-277, all pages.*
Machine translation, Choi, Korean Registration No. 10-0931884, KIPO, Aug. 5, 2015, all pages.*
Machine translation, Choi, Korean Registration No. 10-0931884, Espacenet, Aug. 5, 2015, all pages.*
Machine translation, Ahn, Korean Registration No. 10-1150173, KIPO, Aug. 5, 2015, all pages.*
Machine translation, Ahn, Korean Registration No. 10-1150173, Espacenet, Aug. 5, 2015, all pages.*
W. Kern, This Week's Citation Classic, Current Contents, No. 11, Mar. 14, 1983, all pages.*
W. Kern and D. Puotinen, Cleaning Solutions Based on Hydrogen Peroxide for use in Silicon Semiconductor Technology, Jun. 1970, RCA Review, pp. 187-206, all pages.*
Fumio Shimura, editor, Engineering of Semiconductor Silicon Crystal, 1993, pp. 125-126.*
Machine translation, Yoshimi, Japanese Pat. Pub. No. JP H9-64052, translation date: Aug. 14, 2015, Espacenet, all pages.*
Machine translation, Seo, Korean Pat. Pub. No. 10-2005-0052830, translation date: Aug. 13, 2015, KIPO, all pages.*
Gregory P. Crawford, ed., "Flexible Flat Panel Displays", 2005, Wiley SID Series in Display Technology, pp. 1-25 and 30-55.*
"Flexible Display Key Patent Analysis", Oct. 2008.
Gregory P. Crawford, "Flexible Flat Panel Displays Technology", 2005, Division of Engineering, Brown University, Providence RI.
J.A. Cusumano and M. J. D. Low, "Interactions between Surface Hydroxyl Groups and Adsorbed Molecules", Oct. 17, 1969, Journal of Physical Chemistry, pp. 1950-1957.
Greg W. Griffith, "Quantitation of Silanol in Silicones by FTiR Spectroscopy", Ind. Eng. Chem. Prod. Res. Dev., vol. 23, No. 4 (1984), pp. 590-593.
M.M.R. Howlader, et al., "Room temperature wafer level glass/glass bonding", (2006), Sensors and Actuators A 127, pp. 31-36.
S. Mack, et al., "Gas development at the interface of directly bonded silicon wafers: investigation on silicon-based pressure sensors", (1996), Sensors and Actuators A 55, pp. 273-277.
Hua Zou, et al., "Polymer/Silica Nanocomposites: Preparation, Characterization, Properties, and Applications", Chem. Rev. (2008), 108, 3903-3957.
Ho-Cheol Kim, et al, "Nanostructure Silica and Silica-Derived Materials", IBM Almaden Research Center, San Jose, California, U.S.A.
Y. Duval, et al, "Evidence of the Existence of Three Types of Species at the Quartz-Aqueos Solution Interface at pH 0-10: XPS Surface Group Quantification and Surface Complexation Modeling", J. Phys. Chem. B (2002), 106, 2937-2945.
V. A. Zhabrev, et al, "Ion Diffusion in Oxide Glasses and Melts: I. Bibliography", Glass Physics and Chemistry, vol. 29, No. 2, (2003), pp. 140-159.
Morten M. Smedskjaer, et al, "Modifying glass surfaces via internal diffusion", Journal of Non-Crystalline Solids 356 (2010), pp. 290-298.
Jaime B. Werkmeister, et al, "Investigating Different Methods of Bonding Glass Substrates", Precision Engineering Research Group, Massachusetts Institute of Technology, Cambridge, Massachusetts.

* cited by examiner

MANUFACTURING METHOD FOR DISPLAY DEVICE

CROSS-REFERENCE TO RELATED APPLICATION

This application claims priority to and the benefit of Korean Patent Application No. 10-2013-0167491, filed in the Korean Intellectual Property Office on Dec. 30, 2013, which is hereby incorporated by reference for all purposes as if fully set forth herein.

BACKGROUND

1. Field

The present invention relates to a method of manufacturing a display device.

2. Description of the Related Art

Various electronic components including a thin film transistor (TFT) are manufactured on a substrate formed of glass, and the like, when a flat panel display, for example, a liquid crystal display device or an organic light emitting display device, is manufactured.

Recently, efforts to reduce the thickness of the substrate on which the aforementioned electronic components and the like are formed have been made, in order to obtain a technology for manufacturing a thin and light display device. Also, as research for a flexible display device is being conducted, a thin glass substrate is used instead of a plastic limited to lower process temperatures, as a material for the substrate.

If the thin glass substrate is used, since a bend is generated in the process, after the thin substrate is used as a mother substrate and the mother substrate is contacted on a carrier substrate, the thin film formation process may be performed on the mother substrate. Next, by separating the carrier substrate from the mother substrate, the display device having a reduced thickness may be realized.

However, the mother substrate and the carrier substrate are adhered to each other by the heat of the thin film formation process, such that the separation therebetween is not easy.

It is to be understood that both the foregoing general description and the following detailed description are exemplary and explanatory and are intended to provide further explanation of the invention as claimed.

SUMMARY

Aspects of the present invention provide a method of manufacturing a display device that includes preventing permanent bonding of a carrier substrate and a mother substrate.

A method of manufacturing a display device according to an exemplary embodiment of the present invention includes: performing a surface treatment to at least one of two opposing surfaces of a carrier substrate and a mother substrate; bonding the carrier substrate and the mother substrate; performing a thin film formation process on the mother substrate; and separating the carrier substrate and the mother substrate. The thin film formation process includes a heat treatment, the surface treatment includes using an inorganic acid or an organic acid, and the surface treatment controls a content of —OH, —OH$_2^+$, and —O$^-$ groups of at least one of the opposing surfaces.

According to an exemplary embodiment of the present invention, the substrate surface is treated with the inorganic acid or the organic acid such that the content of —OH, —OH$_2^+$, and —O$^-$ groups existing in the glass substrate surface is controlled.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
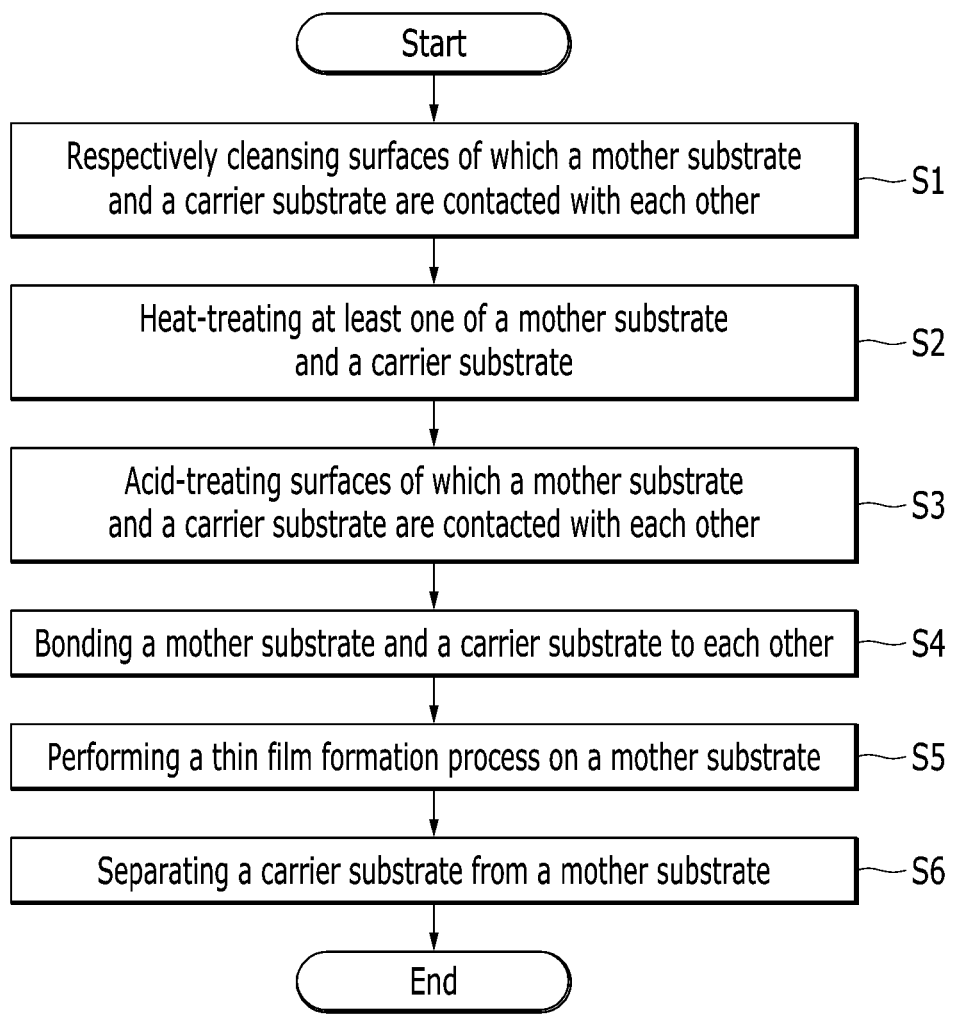
FIG. 1 is a flowchart to explain a method of manufacturing a display device according to an exemplary embodiment of the present invention.

Hereinafter, exemplary embodiments of the present invention will be described in detail with reference to the accompanying drawings. As those skilled in the art would realize, the described embodiments may be modified in various different ways, all without departing from the spirit or scope of the present invention. On the contrary, exemplary embodiments introduced herein are provided to make disclosed contents thorough and complete and sufficiently transfer the spirit of the present invention to those skilled in the art.

In the drawings, the thickness of layers, films, panels, regions, etc., are exaggerated for clarity. It will be understood that when a layer is referred to as being disposed "on" another layer or substrate, it can be disposed directly on the other layer or substrate, or intervening layers may also be present. Like reference numerals designate like elements throughout the specification.

Figure 2:
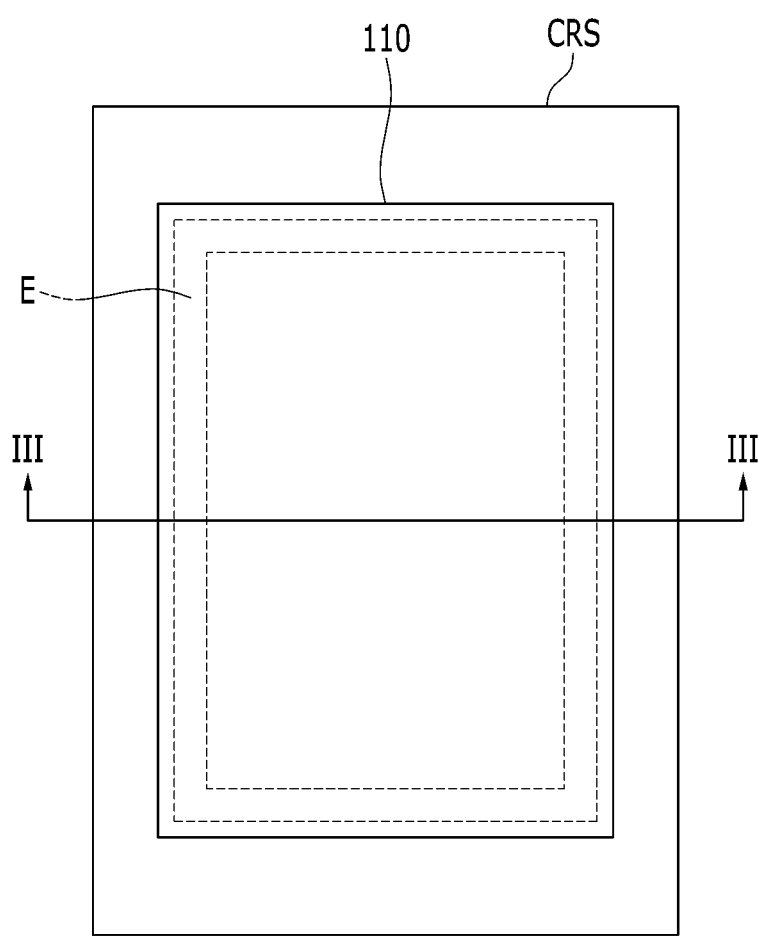
FIG. 2 and FIG. 3 are a top plan view and a cross-sectional view of a mother substrate and a carrier substrate used in a method of manufacturing a display device according to an exemplary embodiment of the present invention.
Figure 3:
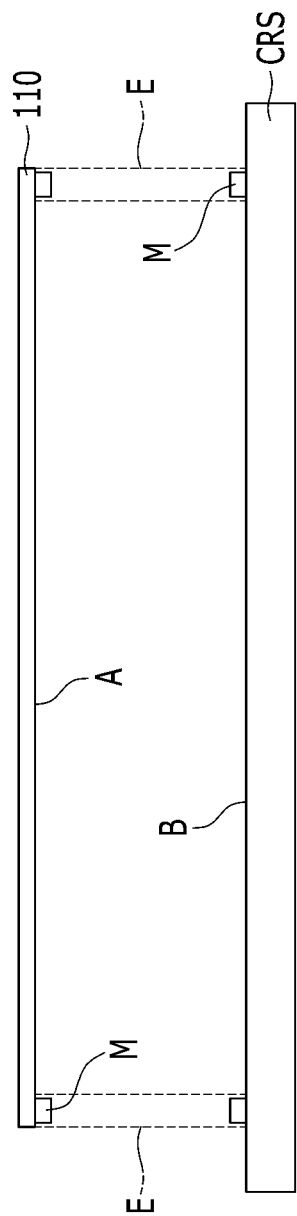

FIG. 1 is a flowchart to explain a method of manufacturing a display device according to an exemplary embodiment of the present invention. FIG. 2 and FIG. 3 are a top plan view and a cross-sectional view of a mother substrate and a carrier substrate used in a method of manufacturing a display device, according to an exemplary embodiment of the present invention. FIG. 3 is a cross-sectional view taken along the line III-III of FIG. 2.

Referring to FIG. 1, a mother substrate and a carrier substrate are provided, and opposing surfaces of the two substrates are cleaned (S1). The opposing surfaces of the two substrates may contact each other. The cleaning may use a piranha solution including sulfuric acid ($H_2SO_4$) and hydrogen peroxide ($H_2O_2$) mixed at an appropriate ratio. In detail, a 96% sulfuric acid ($H_2SO_4$) solution and a 30% hydrogen peroxide ($H_2O_2$) solution are mixed at a ratio of 50 wt %:50 wt %, to make the piranha solution. A temperature of the piranha solution may be maintained at about 60 degrees Celsius to 80 degrees Celsius. Next, the mother substrate and the carrier substrate are cleaned with deionized water. The mother substrate and the carrier substrate may be dried at a temperature of about 50 degrees Celsius, for about 10 minutes.

Next, at least one of the mother substrate and the carrier substrate is applied with a heat treatment (S2). The heat treatment may be performed for about 1 hour, at a temperature of 350 degrees Celsius to 450 degrees Celsius. The heat treatment induces diffusion for positive ions, including $Mg^{2+}$, $Fe^{2+}$, $Ca^{2+}$, $Al^{3+}$, $Sr^{2+}$, $Na^+$, and $K^+$ included in the mother substrate or the carrier substrate, from a bulk portion in the substrate to the surface thereof such that most positive ions may be leached out when performing the surface treatment. Also, surface damage may be prevented in a process of attaching and detaching the mother substrate and the carrier substrate.

Next, at least one surface among the opposing surfaces of the mother substrate and the carrier substrate is applied with an acid treatment (S3).

Referring to FIG. 2 and FIG. 3, a carrier substrate CRS may be wider than the mother substrate 110. The carrier substrate CRS may be thicker than the mother substrate 110. In detail, the thickness of the mother substrate may be less than 0.1 mm, and the thickness of the carrier substrate CRS may be 4 to 10 times the thickness of the mother substrate 110. However, other thickness ratios may be used.

The carrier substrate CRS and the mother substrate 110 include surfaces A and B facing each other, and the acid treatment may be performed thereto. The opposing surfaces A and B of the carrier substrate CRS and the mother substrate 110 are surfaces at which the carrier substrate CRS and the mother substrate 110 are adhered together.

According to the present exemplary embodiment, before the acid treatment, an edge region E of where the mother substrate 110 and the carrier substrate CRS are adhered may be covered by a mask M. The edge region E covered by the mask M is a region not treated with the acid. The edge region E covered by the mask M allows temporary adhesion of the mother substrate 110 and the carrier substrate CRS when laminating the two substrates 110 and CRS. Differently from FIG. 3, the mask M may only cover an edge region E of one of the mother substrate 110 and the carrier substrate CRS. Differently from the present exemplary embodiment, an adhesive may be used to coat the edge region E instead of using the mask. The adhesive may include a material having a high thermal resistance and elasticity. In the present exemplary embodiment, the adhesive may be a polyimide or a polysilicon resin.

The edge region E that is not acid-treated is cut away in a final process.

The acid treatment may use an inorganic acid or an organic acid. The inorganic acid treatment or the organic acid treatment may be performed in the temperature of 25 degrees Celsius to 80 degrees Celsius. In some embodiments, the inorganic acid treatment or the organic acid treatment may be performed at a temperature of 40 degrees Celsius to 50 degrees Celsius.

According to an exemplary embodiment of the present invention, the inorganic acid may include hydrochloric acid (HCl), sulfuric acid ($H_2SO_4$), and/or nitric acid ($HNO_3$). The inorganic acid including hydrochloric acid (HCl) may further include hydrogen peroxide ($H_2O_2$) and water ($H_2O$), and a weight ratio of hydrochloric acid (HCl), hydrogen peroxide ($H_2O_2$), and water ($H_2O$) may be 1:1:6.

The solution including hydrochloric acid (HCl), hydrogen peroxide ($H_2O_2$), and water ($H_2O$), and the mother substrate 110 and the carrier substrate CRS that are previously cleaned, are soaked in the solution for about 10 minutes to 30 minutes. The solution temperature is maintained at from 25 degrees Celsius to 80 degrees Celsius, for example, at 60 degrees Celsius to 80 degrees Celsius. After performing the surface treatment, the substrates may again be cleaned with the deionized water. Next, the mother substrate 110 and the carrier substrate CRS may be dried at temperature of 50 degrees Celsius.

The inorganic acid of sulfuric acid ($H_2SO_4$) includes water ($H_2O$), and a weight ratio of sulfuric acid ($H_2SO_4$) and water ($H_2O$) may be 1:1. Here, the sulfuric acid ($H_2SO_4$) may be a 96 wt % solution that is diluted with deionized (DI) water.

The solution including sulfuric acid ($H_2SO_4$) and water ($H_2O$) is provided, and the same process as that of the surface treatment through the inorganic acid including hydrochloric acid (HCl) may be performed.

Nitric acid ($HNO_3$) may have a concentration of 70% to 80%. The nitric acid ($HNO_3$) may applied using the same process as that of the surface treatment using the inorganic acid including the described hydrochloric acid (HCl).

According to an exemplary embodiment of the present invention, the organic acid is citric acid or the like. The citric acid may be represented by Chemical Formula 1.

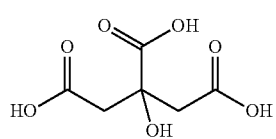

Chemical Formula 1

The organic acid including citric acid may be used for the surface treatment for about 10 minutes to 50 minutes. The temperature of the surface treatment using the organic acid including citric acid may be in a range of about 25 degrees Celsius to 80 degrees Celsius.

Control of the content of an —OH, —$OH_2^+$, or —$O^-$ group by treating the inorganic acid or the organic acid according to an exemplary embodiment of the present invention will be described with reference to FIG. 4 to FIG. 9.

Figure 4:
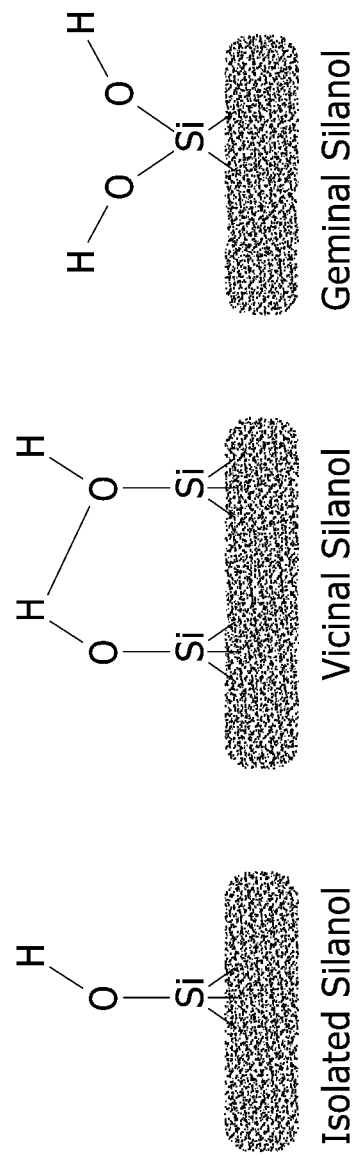
FIG. 4 is a schematic view representing a silanol of three types included in a hydroxyl group.

FIG. 4 is a schematic view representing three types of silanol included in a hydroxyl group. Referring to FIG. 4, isolated silanol, vicinal silanol, and geminal silanol are shown. The isolated silanol is in a state in which one hydroxyl group is bonded to one silicon atom. The vicinal silanol is in a state in which the hydroxyl groups of adjacent silicon atoms are bonded. The geminal silanol is in a state in which two hydroxyl group are bonded to one silicon atom.

Figure 5:
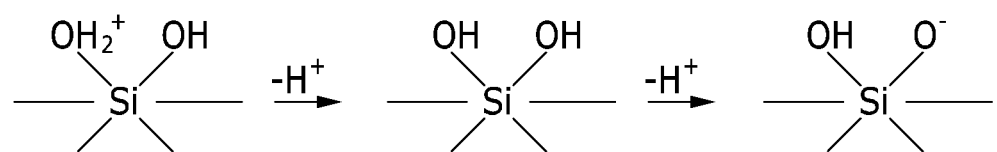
FIG. 5 is a schematic view of three types of hydroxyl group included in a surface of a glass substrate.

FIG. 5 is a schematic view of three types of hydroxyl groups included in the surface of a glass substrate. Referring to FIG. 5, a neutral hydroxyl group may be changed into an —$OH_2^+$ or —$O^-$ group through a process in which hydrogen ($H^+$) is added or subtracted. According to an exemplary embodiment of the present invention, the content of —OH, —$OH_2^+$, and/or —$O^-$ groups may be controlled in at least one of the opposing surfaces of the carrier substrate and the mother substrate, through the inorganic acid or organic acid surface treatment.

Figure 6:
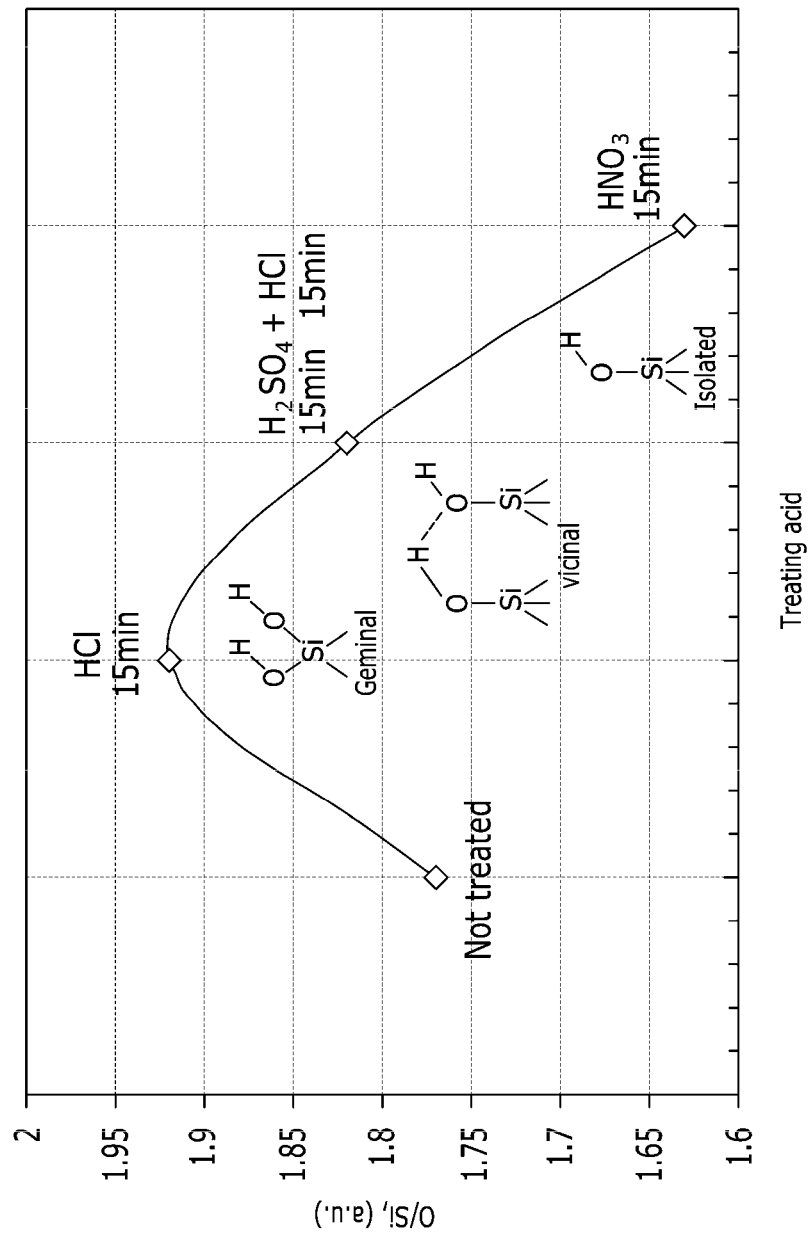
FIG. 6 is a schematic graph representing a ratio of oxygen and silicon depending on the type of acid treatment in a method of manufacturing a display device according to an exemplary embodiment of the present invention.

FIG. 6 is a schematic graph representing a ratio of oxygen and silicon depending on an acid treatment in a method of manufacturing a display device, according to an exemplary embodiment of the present invention. Referring to FIG. 6, the inorganic acid including hydrochloric acid (HCl), the inorganic acid including sulfuric acid ($H_2SO_4$) and hydrochloric acid (HCl), and the inorganic acid including nitric acid ($HNO_3$) are used for the surface treatments. Compared with a comparative example without the surface treatment, in the case of the surface treatment using the inorganic acid including hydrochloric acid (HCl), the geminal silanol is increased, and in the case of the surface treatments using the inorganic including nitric acid $HNO_3$, the isolated silanol is increased.

Figure 7:
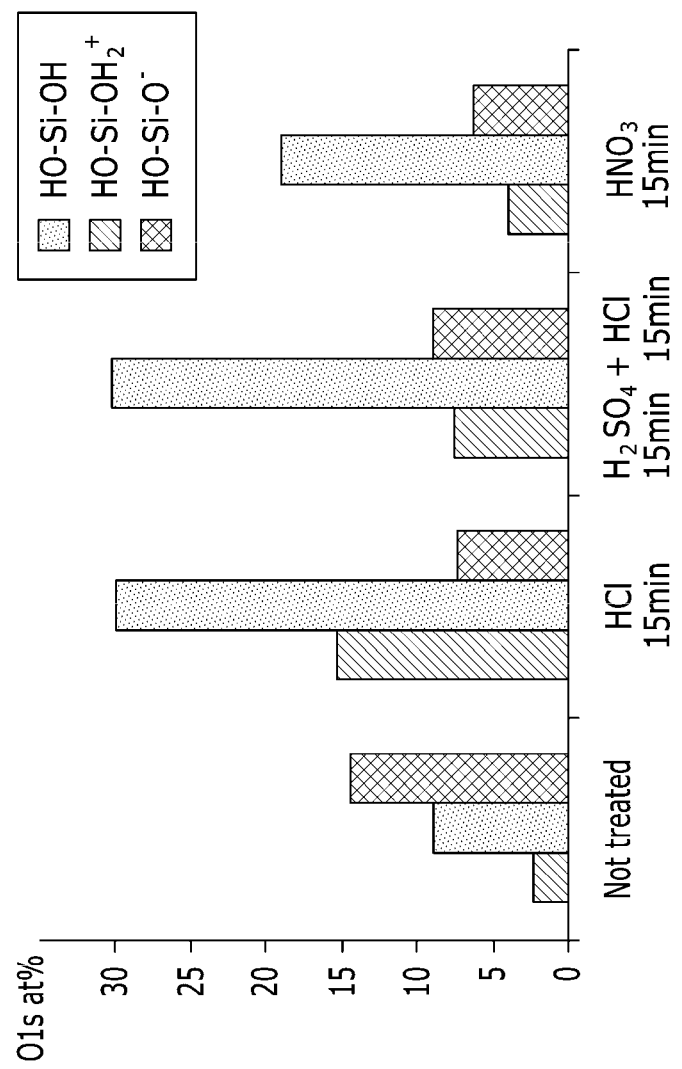
FIG. 7 is a graph representing a charge change of hydroxyl group depending on an acid treatment kind in a method of manufacturing a display device according to an exemplary embodiment of the present invention.

FIG. 7 is a graph representing a charge change of a hydroxyl group depending on an acid treatment in a method of manufacturing a display device, according to an exemplary embodiment of the present invention. Referring to FIG. 7, in the case of the surface treatment using the inorganic acid including hydrochloric acid (HCl), and the inorganic acid including sulfuric acid ($H_2SO_4$) and hydrochloric acid (HCl), neutral —OH groups are increased by about three times, as compared with the comparative example without the surface treatment. In the case of the surface treatment using the inorganic acid including nitric acid ($HNO_3$), neutral —OH groups are increased by about two times, as compared with the comparative example without the surface treatment. In a case of an exemplary embodiment performing the surface treatment, —$O^-$ groups are all decreased and —$OH_2^+$ groups are all increased.

Figure 8:
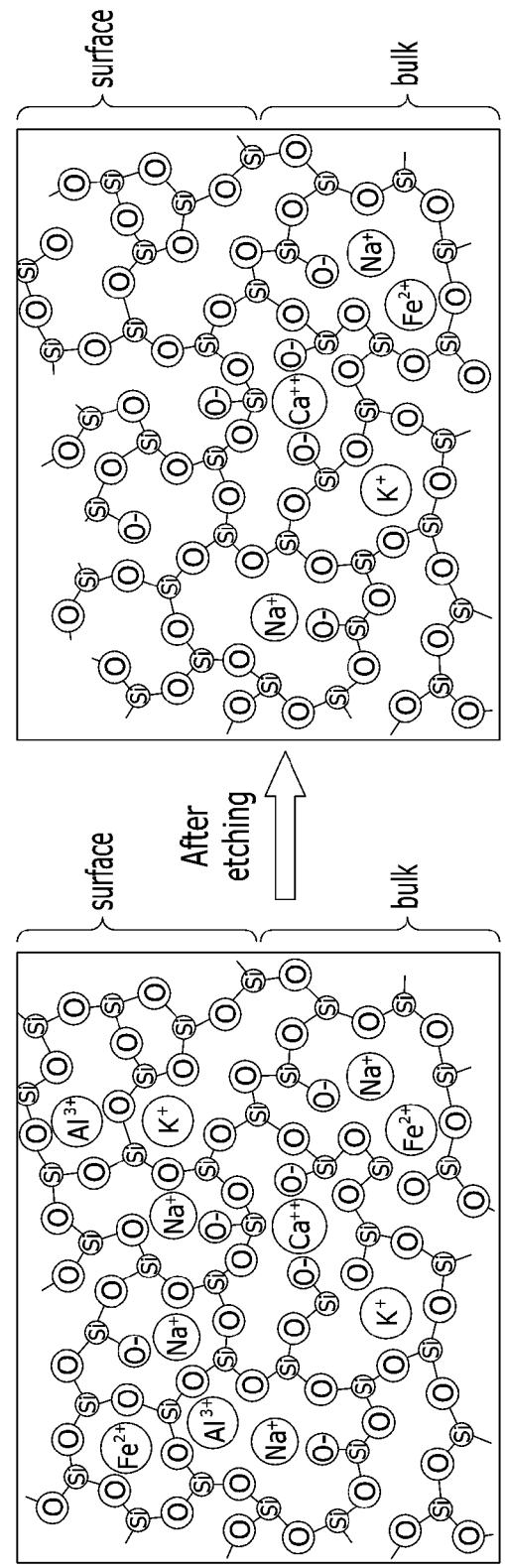
FIG. 8 is a view of a positive ion distribution change of a substrate surface after and before of an acid treatment in a method of manufacturing a display device according to an exemplary embodiment of the present invention.

FIG. 8 is a view of a positive ion distribution change of a substrate surface before and after an acid treatment according to an exemplary embodiment of the present invention. Referring to FIG. 8, the mother substrate and the carrier substrate may be formed of a glass, and a bulk region and surfaces of the glass substrates include at $Mg^{2+}$, $Fe^{2+}$, $Ca^{2+}$, $Al^{3+}$, $Sr^{2+}$, $Na^+$, and $K^+$ ions. If the surface treatment with the inorganic acid or the organic acid is performed, the positive ions included in the glass substrate surface may be leached out.

Figure 9:
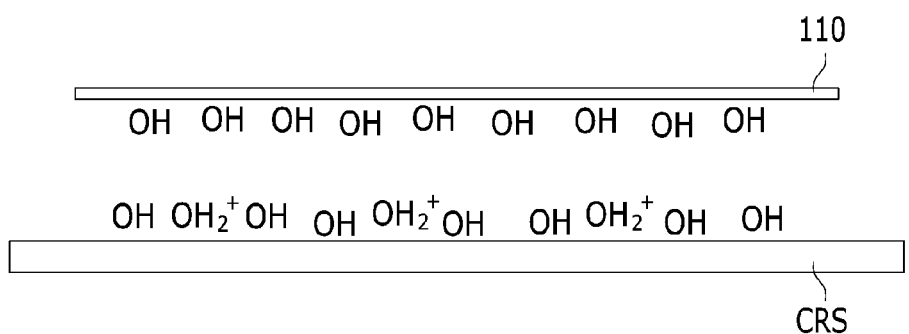
FIG. 9 is a view of a state of a surface treatment of a carrier substrate in a method of manufacturing a display device according to an exemplary embodiment of the present invention.

FIG. 9 is a view of a state of a surface treatment of the carrier substrate CRS in a method of manufacturing a display device, according to an exemplary embodiment of the present invention. Referring to FIG. 9, in a case that only the surface treatment is applied to the carrier substrate CRS, —OH2+ groups are generated only on the carrier substrate CRS, such that a repulsive force is not large between the carrier substrate CRS and the mother substrate 110.

Figure 10:
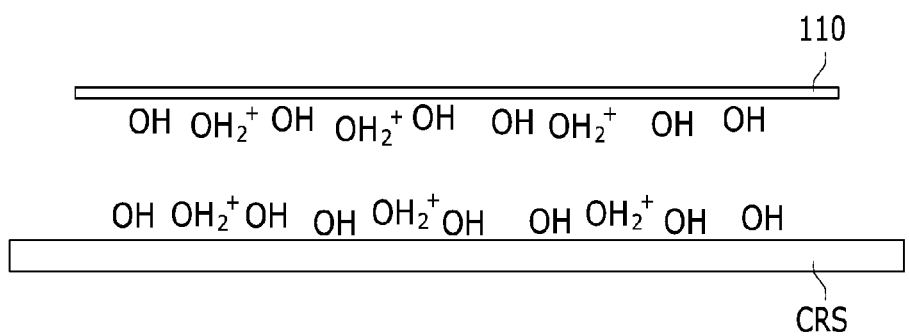
FIG. 10 is a view of a state of a surface treatment of both a mother substrate and a carrier substrate in a method of manufacturing a display device according to an exemplary embodiment of the present invention.

FIG. 10 is a view of a state of a surface treatment of both the mother substrate 110 and the carrier substrate CRS in a method of manufacturing a display device, according to an exemplary embodiment of the present invention. Referring to FIG. 10, since —$OH_2^+$ groups are formed on both the mother substrate 110 and the carrier substrate CRS, a Coulombic repulsion force is increased between the two substrates. Accordingly, the mother substrate 110 and the carrier substrate CRS may be easily separated from each other.

Again referring to FIG. 1, the method of manufacturing the display device according to an exemplary embodiment of the present invention will be described. After the surface treatment using the inorganic acid including one among hydrochloric acid (HCl), sulfuric acid ($H_2SO_4$), and nitric acid ($HNO_3$), or the organic acid including citric acid, the mother substrate 110 and the carrier substrate CRS are combined (S4).

When performing a thin film process that is described later, the substrates 110 and CRS may be laminated to temporarily maintain the combination of the mother substrate 110 and the carrier substrate CRS. In other words, the two substrates 110 and CRS may be temporarily adhered by using an adhesive. The adhesion of the two substrates 110 and CRS by the adhesive may have a combination force, such that the two substrates 110 and CRS are easily separated after the thin film process.

Figure 11:
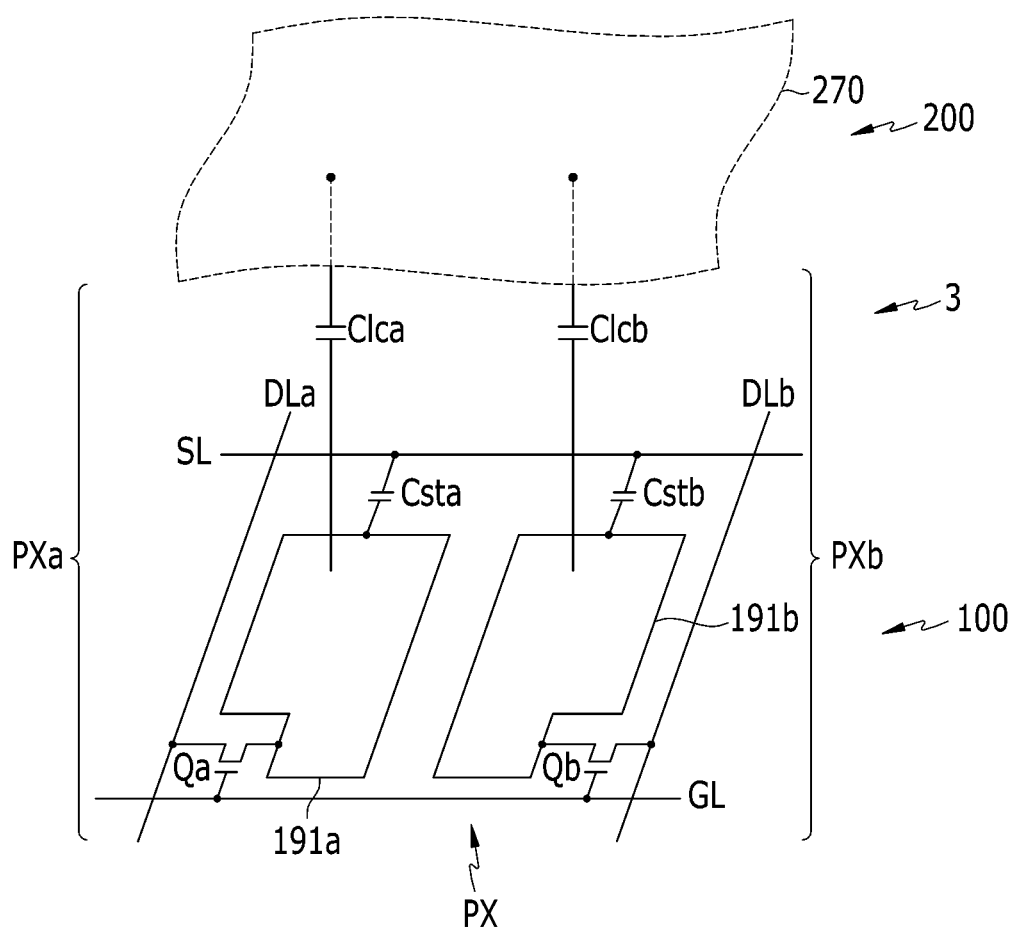
FIGS. 11, 12, and 13 are a circuit diagram, a top plan view, and a cross-sectional view of a liquid crystal display according to a method of manufacturing a display device, according to an exemplary embodiment of the present invention, respectively.
Figure 12:
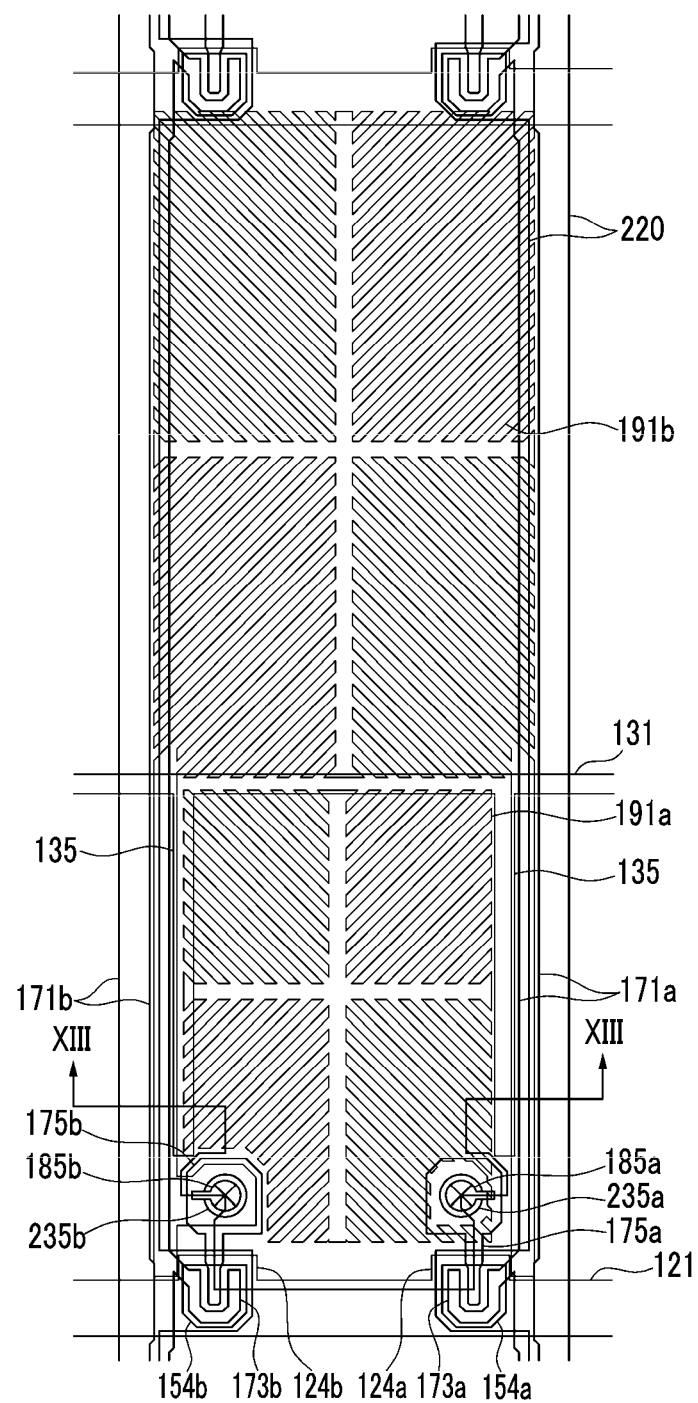
Figure 13:
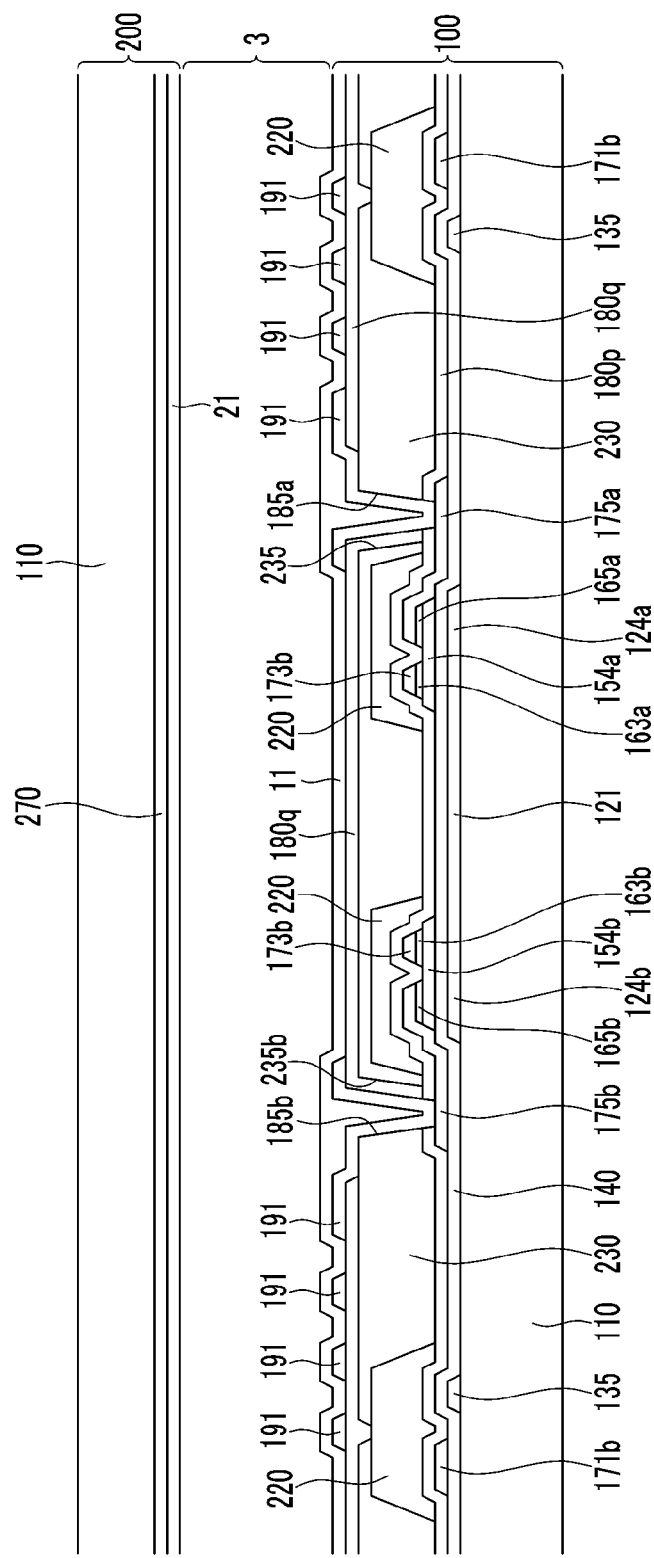

Next, the thin film process to form the display device on the mother substrate 110 may be performed (S5). FIG. 11 to FIG. 13 respectively are a circuit diagram, a top plan view, and a cross-sectional view of a liquid crystal display manufactured according to an exemplary embodiment of the present invention. FIG. 11 is an equivalent circuit diagram of one pixel of a liquid crystal display according to an exemplary embodiment of the present invention.

Referring to FIG. 11, a liquid crystal display according to an exemplary embodiment of the present invention includes a thin film transistor array panel 100 and an opposing common electrode panel 200. A liquid crystal layer 3 is interposed therebetween. The liquid crystal display includes signal lines including a plurality of gate lines GL, a plurality of pairs of data lines DLa and DLb, a plurality of storage electrode lines SL, and a plurality of pixels PX connected to the signal lines.

Each pixel PX includes a pair of subpixels PXa and PXb. Each subpixel PXa/PXb has a switching element Qa/Qb, a liquid crystal capacitor Clca/Clcb, and a storage capacitor Csta/Cstb. Each switching element Qa/Qb is a three-terminal element such as a thin film transistor provided on the lower panel 100, having a control terminal connected to the gate line GL, an input terminal connected to the data line DLa/DLb, and an output terminal connected to the liquid crystal capacitor Clca/Clcb and the storage capacitor Csta/Cstb.

The liquid crystal capacitor Clca/Clcb uses a subpixel electrode and a common electrode 270 as two terminals. The liquid crystal layer 3 between electrodes 191a/191b and 270 operates as a dielectric material. The storage capacitor Csta/Cstb serves as a subsidiary to the liquid crystal capacitor Clca/Clcb and includes a storage electrode line SL provided on the lower display panel 100, overlapping the subpixel electrodes 191a/191b, and an insulator interposed therebetween. A common voltage is applied thereto.

It has been determined that a voltage difference is generated between the voltages charged to the two liquid crystal capacitors Clca and Clcb. For example, the data voltage applied to the liquid crystal capacitor Clca is different from the data voltage applied to the liquid crystal capacitor Clcb. Therefore, when the voltages of the first and second liquid crystal capacitors Clca and Clcb are appropriately adjusted, it is possible to make an image viewed from the side be as similar as possible to an image viewed from the front. As a result, it is possible to improve side visibility.

FIG. 12 is a layout view of a liquid crystal display according to another exemplary embodiment of the present invention, and FIG. 13 is a cross-sectional view taken along the line XIII-XIII of FIG. 12. Referring to FIG. 12 and FIG. 13, a liquid crystal display according to an exemplary embodiment of the present invention includes the lower panel 100, the opposing upper panel 200, and the liquid crystal layer 3 interposed between the two display panels 100 and 200.

Firstly, the lower panel 100 will be described. A plurality of gate lines 121 and a plurality of storage electrode lines 131 and 135 are formed on a mother substrate 110. A thin film process is performed with a carrier substrate (not shown) is adhered under the mother substrate 110. The gate lines 121 transmit gate signals and are substantially extended in a transverse direction. Each gate line 121 includes a plurality of first and second gate electrodes 124a and 124b protruding upward.

The storage electrode lines include a stem 131 extending substantially parallel to the gate lines 121, and a plurality of storage electrodes 135 extending from the stem. However, the shapes and arrangement of the storage electrode lines 131 and 135 may be modified in various forms. A gate insulating layer 140 is formed on the gate lines 121 and the storage electrode lines 131 and 135. First and second semiconductors 154a and 154b made of amorphous silicon or crystalline silicon are formed on the gate insulating layer 140.

Pairs of ohmic contact members 163a, 165a, and 163b, and 165b are respectively formed on the semiconductors 154a and 154b. The ohmic contacts 163b and 165b may be made of n+ hydrogenated amorphous silicon, in which a silicide or an n-type impurity is doped at a high concentration. A plurality of data lines 171a and 171b and a plurality of first and second drain electrodes 175a and 175b are formed on the ohmic contact members 163b and 165b and the gate insulating layer 140.

The data lines 171 transmit data signals and substantially extend in a vertical direction, so as to cross the gate lines 121 and the stems 131 of the storage electrode lines. The data lines 171a and 171b include first and second source electrodes 173a and 173b bent in a U-shape by extending toward the first and second gate electrodes 124a and 124b. The first and second drain electrodes 175a and 175b face the first and second source electrodes 173a and 173b with respect to the first and second gate electrodes 124a and 124b.

The drain electrodes 175a and 175b include one end portion extending upward, which is partially surrounded by the first source electrode 173a, and another end portion having a wide area so as to be connected to another layer. However, the shape and arrangement of the data lines 171a and 171b including the first and second drain electrodes 175a and 175b may be modified in various ways.

The first and second gate electrodes 124a and 124b, the first and second source electrodes 173a and 173b, and the first and second drain electrodes 175a and 175b, along with the semiconductors 154a and 154b, form first and second TFTs Qa and Qb. Each of the first and second TFTs Qa and Qb has a channel formed in the semiconductors 154a and 154b and disposed between the first and second source electrodes 173a and 173b and the first and second drain electrodes 175a and 175b, respectively.

The ohmic contacts 163b and 165b are interposed between the underlying semiconductors 154a and 154b and the overlying data lines 171a and 171b and drain electrode 175a and 175b, and may reduce the contact resistance therebetween. The semiconductors 154a and 154b include exposed portions that are not covered with the data lines 171a and 171b and the drain electrodes 175a and 175b, such as portions located between the source electrodes 173a and 173b and the drain electrodes 175a and 175b.

A lower passivation film 180p made of a silicon nitride or a silicon oxide is formed on the data lines 171a and 171b, the drain electrodes 175a and 175b, and the exposed semiconductors 154a and 154b. Light blocking members 220 separated by a predetermined interval are formed on the lower passivation layer 180p. The light blocking member 220 may include a straight portion extending in a vertical direction and a quadrangular portion corresponding to the thin film transistor, and prevents light leakage.

A plurality of color filters 230 is formed on the lower passivation layer 180p and the light blocking members 220. The color filters 230 are disposed mostly inside the regions surrounded by the light blocking members 220. The color filter 230 includes a plurality of openings 235a and 235b positioned on the first and second drain electrodes 175a and 175b. The color filter 230 may be, particularly, a green color filter. Here, the lower passivation layer 180p may prevent pigment of the color filter 230 from flowing into the exposed portions of the semiconductors 154a and 154b.

An upper passivation layer 180q is formed above the light blocking member 220 and the color filter 230. The upper passivation layer 180q may be made of an inorganic insulating material, such as a silicon nitride or silicon oxide, seals the color filter 230 in place, and prevents defects such as an afterimage that may occur when a screen is driven. In particular, the upper passivation layer 180q suppresses contamination of the liquid crystal layer 3 due to an organic material, such as a solvent, flowing in from the color filter 230. However, the light blocking member 220 may be positioned at the upper display panel 200. Contact holes 185a and 185b, through which the first and second drain electrodes 175a and 175b are exposed, are formed at the upper passivation layer 180q and the lower passivation layer 180p.

Pixel electrodes 191 are formed on the upper passivation layer 180q, and the aforementioned color filter 230 may extend along a row of the pixel electrodes 191. Further, a storage electrode 135 is positioned between the pixel electrode 191 and the data lines 171a and 171b. The pixel electrode 191 may be made of a transparent conductive material, such as ITO or IZO, or a reflective metal, such as aluminum, silver, chrome, or an alloy thereof. Each pixel electrode 191 may include the first and second sub-pixel electrodes 191a and 191b that are separated from each other.

The first and second sub-pixel electrodes 191a and 191b are physically and electrically connected with the first and second drain electrodes 175a and 175b through the contact holes 185a and 185b, and receive the data voltages from the first and second drain electrodes 175a and 175b. An alignment layer 11 may be formed on the pixel electrodes 191.

Next, the upper display panel 200 will be described. The upper display panel 200 includes the common electrode 270 formed on the transparent insulation substrate 210, and an alignment layer 21 formed on the common electrode 270. The respective alignment layers 11 and 21 may be vertical alignment layers. A polarizer (not illustrated) may be included at external surfaces of the lower display panel 100 and the upper display panel 200.

The liquid crystal layer 3 is interposed between the lower display panel 100 and the upper display panel 200. The liquid crystal layer 3 may have negative dielectric anisotropy. The liquid crystal display device has been described, but the description of the method of manufacturing the display device according to the exemplary embodiment of the present invention may also be applied to an organic light emitting display device and other display devices including the process of forming the thin film, without being limited thereto.

Next, the carrier substrate is separated from the mother substrate (S6). As described above, after the thin film formation process is performed on the mother substrate 110 mounted on the carrier substrate CRS, a strong fusion between the carrier substrate CRS and the mother substrate 110 is made possible by anodic bonding or fusion bonding formed between hydroxyl groups existing at the surfaces of the two substrates CRS and 110. This phenomenon is generated since the thin film formation process may include heat treatment at a high temperature of about 350° C. or more.

The anodic bonding is a phenomenon in which sodium ions are generated in a high temperature electric field state, and an electrostatic force is generated at an interface between the mother substrate 110 formed of glass and the carrier substrate CRS, so that a covalent bond is formed by inter-diffusion. The fusion bonding is a phenomenon in which glass is adhered by Van der Waals forces, and hydrogen bonding when glass which includes no foreign substances and has surface roughness of 5 nm or less, is in a hydrophilic state, and adheres at a high temperature.

However, according to the method of manufacturing the display device according to the exemplary embodiment of the present invention, since at least one of the carrier substrate CRS and the mother substrate 110 is surface-treated, before the thin film process is performed, the bonding degree of the two substrates is weak. Also, although the thin film process includes the heat treatment process at more than 350 degrees Celsius, the carrier substrate CRS and the mother substrate 110 may be easily separated.

Further, the step of separating the mother substrate and the carrier substrate includes a step of cutting and removing the edge region E described in FIG. 3. This is because the portion that is not applied with the acid treatment due to the mask M or the region where the adhesive is coated is a region where permanent bonding is generated.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a display device, comprising:
   performing a surface treatment on at least one of two opposing surfaces of a carrier substrate and a mother substrate, the surface treatment comprising applying an inorganic acid or an organic acid;
   bonding the carrier substrate and the mother substrate;
   performing a thin film formation process for a display on the mother substrate; and
   separating the carrier substrate and the mother substrate,
   wherein the thin film formation process comprises a heat treatment, and
   wherein the surface treatment is configured to increase a content of —OH and —$OH_2^+$ groups, and to reduce a content of an —$O^-$ group of the at least one of two opposing surfaces.

2. The method of claim 1, further comprising a heat-treatment of at least one of the carrier substrate and the mother substrate before the surface treatment.

3. The method of claim 2, wherein the inorganic acid comprises at least one from the group consisting of hydrochloric acid (HCl), sulfuric acid ($H_2SO_4$), and nitric acid ($HNO_3$).

4. The method of claim 3, wherein the inorganic acid comprising hydrochloric acid (HCl) further comprises hydrogen peroxide ($H_2O_2$) and water ($H_2O$), and a weight ratio of the hydrochloric acid (HCl), hydrogen peroxide ($H_2O_2$), and water ($H_2O$) is 1:1:6.

5. The method of claim 3, wherein the inorganic acid comprising sulfuric acid ($H_2SO_4$) further comprises water ($H_2O$), and a weight ratio of sulfuric acid ($H_2SO_4$) to water ($H_2O$) is 1:1.

6. The method of claim 3, wherein the nitric acid ($HNO_3$) has a concentration of 70% to 80%.

7. The method of claim 3, wherein the surface treatment using the inorganic acid is performed for 10 minutes to 30 minutes.

8. The method of claim 2, wherein the organic acid comprises citric acid.

9. The method of claim 8, wherein the surface treatment using the organic acid is performed for 10 minutes to 50 minutes.

10. The method of claim 2, wherein the heat-treatment of at least one of the carrier substrate and the mother substrate before the surface treatment is performed in a temperature range of 350 degrees Celsius to 450 degrees Celsius.

11. The method of claim 2, wherein the surface treatment is performed in a temperature range of 25 degrees Celsius to 80 degrees Celsius.

12. The method of claim 1, wherein:
   the mother substrate and the carrier substrate comprise at least one ion selected from the group consisting of $Mg^{2+}$, $Fe^{2+}$, $Ca^{2+}$, $Al^{3+}$, $Sr^{2+}$, $Na^+$, and $K^+$; and
   the at least one ion is leached from the corresponding surface that is surface-treated in the surface treatment step.

13. The method of claim 1, wherein the inorganic acid comprises hydrochloric acid (HCl) and sulfuric acid ($H_2SO_4$).

14. The method of claim 1, further comprising coating an adhesive at an edge region including of portions of the carrier substrate and the mother substrate, such that the carrier substrate and the mother substrate are bonded before the surface treatment is performed.

15. The method of claim 14, further comprising removing the edge region.

16. The method of claim 1, wherein when the surface treatment is performed, an edge region of the carrier substrate and the mother substrate is covered with a mask.

17. The method of claim 16, further comprising removing the edge region.

18. The method of claim 1, wherein the organic acid comprises citric acid.

19. The method of claim 18, further comprising heat-treating at least one of the carrier substrate and the mother substrate, before the surface treatment is performed.

20. The method of claim 19, wherein:
   the mother substrate and the carrier substrate comprise at least one ion selected from the group consisting of $Mg^{2+}$, $Fe^{2+}$, $Ca^{2+}$, $Al^{3+}$, $Sr^{2+}$, $Na^+$, and $K^+$; and
   the at least one ion is leached from the corresponding surface by the citric acid.

* * * * *